United States Patent [19]

Mazin et al.

[11] Patent Number: 4,484,087
[45] Date of Patent: Nov. 20, 1984

[54] CMOS LATCH CELL INCLUDING FIVE TRANSISTORS, AND STATIC FLIP-FLOPS EMPLOYING THE CELL

[75] Inventors: Moshe Mazin; William E. Engeler, both of Scotia, N.Y.

[73] Assignee: General Electric Company, Schenectady, N.Y.

[21] Appl. No.: 478,015

[22] Filed: Mar. 23, 1983

[51] Int. Cl.$^3$ ............... H03K 3/356; H03K 19/096; H03K 23/22; G11C 19/28
[52] U.S. Cl. ............... 307/272 A; 307/443; 307/279; 307/452; 377/68; 377/79; 377/105; 377/117
[58] Field of Search ............... 307/272 A, 279, 451, 307/452, 453; 377/68, 72, 74, 79, 81, 105, 116, 117, 121

[56] References Cited

U.S. PATENT DOCUMENTS

| | | | |
|---|---|---|---|
| 3,573,498 | 4/1971 | Ahrons | 377/79 |
| 3,675,144 | 7/1972 | Zuk | 377/79 X |
| 3,716,723 | 2/1973 | Heuner et al. | 307/221 |
| 3,716,724 | 2/1973 | Parrish et al. | 307/221 |
| 3,745,371 | 7/1973 | Suzuki | 377/68 X |
| 3,812,384 | 5/1974 | Skorup | 307/272 A X |
| 3,989,955 | 11/1976 | Suzuki | 307/279 X |
| 4,114,049 | 9/1978 | Suzuki | 307/452 X |
| 4,124,807 | 11/1978 | Herber | 307/279 |
| 4,447,745 | 5/1984 | Takemae et al. | 307/269 |

FOREIGN PATENT DOCUMENTS 74350 7/1978 Japan ............... 307/452

OTHER PUBLICATIONS

RCA Datasheet, CD4013A Types, "Dual 'D'-Type Flip-Flop".
RCA Datasheet, CD4015A Types, "COS/MOS Dual 4-Stage Static Shift Register".
CD4006A Types and CD4006B Types, "COS/MOS 18-Stage Static Shift Register".

Primary Examiner—Larry N. Anagnos
Attorney, Agent, or Firm—Julius J. Zaskalicky; James C. Davis, Jr.; Marvin Snyder

[57] ABSTRACT

A five-transistor CMOS static latch cell useful in static flip-flop applications comprises, in one embodiment, an inverting latch cell having a data input node, a data storage node, a complementary data output node, a clock input node for selectively enabling or not enabling the cell, and a pair of voltage supply nodes. An essentially standard CMOS inverter has an output connected to the complementary data output node. The inverter includes a complementary pair of IGFETs i.e., an N-channel IGFET and a P-channel IGFET. The channel of the N-channel inverter IGFET selectively electrically connects the complementary data output node to ground. The channel of the P-channel inverter IGFET selectively electrically connects the complementary data output node to the voltage supply node. The inverter transistor gate electrodes are connected to the data storage node. A cross-coupled switching element comprising a second P-channel IGFET has its gate connected to the complementary data output node and is arranged to selectively connect the data storage node to the voltage supply node. A third P-channel IGFET has its channel arranged to selectively connect the data storage node to the voltage supply node when the cell is disabled. A second N-channel IGFET is arranged to selectively connect the data storage node to the data input node. A high impedance leakage current discharge path electrically connects the data storage node to the one voltage supply node, and discharges any leakage current on the data storage node. The high impedance leakage current discharge path may take a variety of forms, and need not comprise a discrete resistor.

12 Claims, 11 Drawing Figures

CMOS TRANSMISSION GATE

CMOS INVERTER

MASTER SECTION 162    SLAVE SECTION 164

CMOS LATCH CELL INCLUDING FIVE TRANSISTORS, AND STATIC FLIP-FLOPS EMPLOYING THE CELL

BACKGROUND OF THE INVENTION

The present invention relates generally to circuits of the type fabricated on a monolithic silicon semiconductor chip employing insulated-gate field-effect transistors (IGFETs) and, more particularly, to a five-transistor latch cell which can be fabricated employing complementary metal-oxide-semiconductor (CMOS) transistor technology and which can be employed to form various types of static flip-flops having low transistor counts.

One form of flip-flop useful in digital logic applications is a D-type master-slave flip-flop, also known as an edge-triggered D-type flip-flop. Such a flip-flop has a data input (D input), either one or a pair of complementary data outputs (Q or $\bar{Q}$ or both), and a clock input. In operation, a logic state is retained or latched at the output or outputs indefinitely so long as the clock level remains either high (binary "1") or low (binary "0"). Data in the form of a logic level is transferred to the data output (Q output) upon a specified clock pulse edge or transition, for example, a transition of the clock input from logic low to logic high. If provided, complementary data is available at the $\bar{Q}$ output.

Typically, a plurality of such D-type, master-slave flip-flops are included in a single integrated circuit. As one example, such flip-flops are available in packages of two flip-flop circuits formed on a monolithic silicon semiconductor chip and included in a single integrated circuit package. A specific example of such an integrated circuit, commercially available is an RCA Type No. CD4013 "Dual 'D'-Type Flip-Flop". As another example, a plurality of such D-type master-slave flip-flops can be connected in series to form a static shift register. Example of such static shift registers, commercially available in integrated circuit form, are an RCA Type No. CD4015 "COS/MOS Dual Four-Stage Static Shift Register", which comprises two four-stage shift registers available in a single integrated circuit package, and an RCA Type No. CD4006 "COS/MOS 18-Stage Static Shift Register". In another form, such flip-flops may be included as but a small part of a much larger integrated circuit (e.g. large scale integration), in combination with either a variety of other types of digital logic elements and circuits comprising a functional device.

In either case, the integrated circuit typically includes a number of other elements supporting the flip-flop circuit. These other elements include at least voltage supply lines or nodes. Also, typical D-type, master-slave flip-flops require complementary clock inputs (e.g. CLK and $\overline{CLK}$) and a pair of inverters will typically be included, common to a number of individual D-type master-slave flip-flops to provide complementary clock inputs.

As implied by the name of such a flip-flop, each flip-flop comprises two sections, known in the art as a "master" section and a "slave" section, respectively. Each of the sections may also be viewed as an inverting latch cell. One general type of prior art inverting latch cell typical of CMOS digital logic implementation comprises a CMOS transmission gate at the cell input supplying a pair of cross-coupled CMOS inverters, one of which may be termed a "forward-going" inverter because its output is connected to the cell output, and the other of which may be termed a "reverse-going" inverter. In the cross-coupled configuration, the output of one inverter is connected to the input of the other inverter, and the output of the other inverter is connected to the input of the one inverter through a standard CMOS transmission gate. A standard CMOS transmission gate includes a complementary pair of IGFETs, and a standard CMOS inverter also includes a complementary pair of IGFETs. Thus, each inverting latch cell or flip-flop section includes eight IGFETs, for a total of sixteen IGFETs in the overall D-type master-slave flip-flop.

To form an edge-triggered D-type flip-flop, the two inverting latch cells are connected in series, with the clock inputs connected to the two transmission gates such that the transmission gates are alternately enabled. Typically, the transmission gate of the first or "master" section is enabled when the clock input is low, and the transmission gate of the second or "slave" section is enabled when the clock input is high.

In general operation, with the clock input low, input data is passed via the master section transmission gate into the master section latch comprising a pair of cross-coupled inverters. When the clock input goes high, the transmission gate of the master section is no longer enabled, isolating the data input from the flip-flop. At the same time, the slave section transmission gate is enabled, coupling inverted data from the master section into the latch of the slave section, where the data appears at the outputs. When the clock goes low, the transmission gate of the slave section is no longer enabled, isolating the slave section from the rest of the flip-flop, and the slave section accordingly retains the output logic voltage levels until a subsequent low to high clock transition.

In the design of integrated circuits, particularly large scale integrated circuits comprising a multiplicity of individual logic elements, important considerations are minimizing the transistor count and reducing the circuit area required for each individual logic element or circuit.

In general, transistor count can be minimized through choice of circuit configuration. One particular approach is to eliminate the need for transmission gates as identifiable elements by employing modified CMOS inverters which include isolation diodes appropriately connected such that the inverters are capable of being selectively enabled or disabled depending upon the sense of the supply voltage polarity applied thereto. The inverter voltage supply nodes, rather than being connected to constantly-energized voltage supply lines, are connected to the complementary clock inputs, CLK and $\overline{CLK}$. Thus, a particular inverter is either enabled or disabled depending upon the clock input. When such an inverter is disabled, its output impedance is quite high, to the extent that the inverter output is essentially an open circuit with respect to either logic voltage level. Specific examples of such modified CMOS inverter circuits, capable of being selectively enabled or disabled, are disclosed in Heuner et al U.S. Pat. No. 3,716,723 and Parrish et al U.S. Pat. No. 3,716,724.

However, latch circuits employing these modified CMOS inverter circuits heavily load the clock inputs, tending to slow circuit operation.

SUMMARY OF THE INVENTION

Accordingly, it is an object of the invention to provide an inverting latch cell which may be employed as either section in a master-slave type flip-flop, which has a lower transistor count than previous such circuits, and which is implemented in MOS integrated circuit form.

It is another object of the invention to provide various forms of flip-flops, including edge-triggered D-type flip-flops, useful in such applications as static shift register stages or divide-by-two flip-flops which may be employed as asynchronous binary counters.

In accordance with the invention, an inverting latch cell is provided which employs only four IGFETs, and a high impedance leakage current discharge path which can be fabricated employing minimal semiconductor chip area. Master/slave flip-flop circuits including a pair of the subject inverting latch cells accordingly include a total of eight IGFETs and two high impedance leakage current discharge resistors.

Briefly, and in accordance with an overall concept of the invention, it is recognized that the transistor count of the prior art inverting latch cell of the general type comprising a transmission gate including a complementary pair of IGFETs, and further comprising a latch including a pair of cross-coupled inverters each having a complementary pair of IGFETs, can be reduced. In particular, it is recognized that one of the complementary pair of IGFETs in the reverse-going inverter can be replaced by a high impedance leakage current discharge resistor and, at the same time, one of the complementary pair of IGFETs in the transmission gate can be eliminated.

In accordance with one embodiment, there is provided inverting latch cell having a data input node, a complementary data output node, and a clock input node for selectively enabling or not enabling the cell. The cell includes a pair of voltage supply nodes, and a data storage node. What is essentially a standard CMOS inverter has an inverter input connected to the data storage node and an inverter output connected to the complementary data output node, i.e., in a forward-going direction. In particular, the inverter includes a complementary pair of IGFETs, one of the inverter IGFETs having a channel of one conductivity type (for example, an N-channel IGFET) arranged to selectively electrically connect the complementary data output node to one of the voltage supply nodes (for example, ground). The other of the inverter transistors has a channel of the opposite conductivity type (in this example, a P-channel IGFET) arranged to selectively electrically connect the complementary data output node to the other of the voltage supply nodes (in this example $+V_{DD}$). The inverter transistors have gate electrodes for controlling the conductances of the respective inverter transistor channels, and the gate electrodes are connected to the data storage node.

Rather than including another, reverse-going, inverter cross-coupled with the one inverter in a latching configuration as in prior art circuits, the present invention includes a cross-coupled switching element having an input connected to the complementary data output node and a switching element output connected to the data storage node. The switching element comprises a single IGFET having a channel of the opposite conductivity type (in this example, a P-channel IGFET) arranged to selectively connect the data storage node to the other voltage supply node (in this example, $+V_{DD}$). Conductance of the switching element transistor channel is controlled through a gate electrode which is connected to the complementary data output node.

The aforementioned high impedance leakage current discharge path is provided for electrically connecting the data storage node to the one voltage supply node, and therefore serves to discharge any leakage current appearing on the data storage node. As will be apparent from the description hereinbelow, the high impedance leakage current discharge path may take a variety of forms, and need not comprise a discrete resistor. In one specific form, the leakage current discharge path comprises a lightly-doped semiconductor region having a relatively high resistivity. In another specific form it may comprise a resistor formed by a relatively lightly doped portion of the polycrystalline silicon layer utilized as a gate electrode material for other portions of the circuit. In a further specific form, the high impedance leakage current discharge path comprises an enhancement-mode IGFET having a channel of the opposite conductivity type, e.g., a P-channel IGFET, which serves as a leakage transistor. The source electrode of the leakage transistor is electrically connected to the data storage node, and the drain and gate electrodes are both connected to the one voltage supply node, e.g., circuit ground. Thus, the leakage transistor is biased into conduction whenever sufficient voltage is applied between its source and drain terminals. The leakage transistor is configured so as to have a relatively lower conductivity relative to the conductivity of the switching element transistor. For example, the leakage transistor can be provided with a much greater gate oxide thickness, a longer channel, a narrower channel or any combination of these.

Significantly, because the leakage transistor is of the opposite conductivity type, it can be fabricated with essentially no increase in chip area in cases where the substrate is of the one conductivity type since opposite conductivity type well regions need not be provided. Moreover, the more complex fabrication of a depletion-mode transistor such as are sometimes provided where load resistors are required in various circuits, is not required.

In other forms, the high impedance leakage current discharge path may comprise paths through reverse-biased PN junctions inherent in the device structure.

The final element of the basic latch cell is a transmission gate including a single IGFET having a channel of the one conductivity type (in this example, an N-channel IGFET) arranged to selectively connect the data storage node to the data input node. The gate electrode of the transmission gate transistor controls the conductance of the transmission gate transistor channel and is connected to the clock input node.

An edge-triggered D-type flip-flop in accordance with the invention comprises two inverting latch cells of the type summarized above, one of these cells serving as a master section of the flip-flop, and the other cell serving as the slave section of the flip-flop. The two cells or sections are connected to each other in a conventional manner, with the data input node of the master cell connected to the flip-flop data input node, the complementary data output node of the master cell connected to the input node of the slave cell, and the slave cell data output node being connected to the flip-flop data output node, i.e., the Q output. The clock input node of the master cell is connected to one of a pair of flip-flop complementary clock input nodes, and the clock input node of the slave cell is connected to the other of the pair flip-flop clock input nodes such that the cells are alternately enabled.

In accordance with the invention, a plurality of edge-triggered D-type flip-flops as summarized above can be serially connected in a static shift register configuration. Specifically, each individual edge-triggered D-type flip-flop comprises a single shift register stage, and the shift register stages are connected in series. The first stage data input node serves as the shift register data input node, the last stage data output node serves as the shift register output node, and each intermediate stage has its data input node connected to the preceding stage data output node, and has its data output node connected to the succeeding stage data input node.

Still further, in accordance with the invention a divide-by-two flip-flop is provided of the general type comprising an edge-triggered D-type flip-flop having its complementary data output ($\bar{Q}$ output) connected back to the data (D) input. As is known, with an alternating clock input signal the output signal of such divide-by-two flip-flop has a frequency of one-half the input frequency. Such flip-flops are useful as asynchronous binary frequency counters wherein the Q or $\bar{Q}$ output of each stage is connected to the clock input of the succeeding stage.

More particularly, in accordance with the invention the divide-by-two flip-flop comprises a master cell and a slave cell. The master cell comprises an inverting latch cell in accordance with the invention as summarized above. However, since a D-type flip-flop connected as a divide-by-two counter requires that a Q output be available, the slave cell requires a pair of CMOS inverters. Thus, the slave cell comprises, in series, a data input node, a transmission gate, a slave cell storage node, a pair of CMOS inverters having a slave cell complementary data storage node which also serves as the Q output of the flip-flop.

BRIEF DESCRIPTION OF THE DRAWINGS

While the novel features of the invention are set forth with particularity in the appended claims, the invention, both as to organization and content, will be better understood and appreciated, along with other objects and features thereof from the following detailed description taken in conjunction with the drawings, in which:

FIG. 1D is an electrical schematic diagram of a prior art standard CMOS inverter comprising a complementary pair of IGFETs such as may be employed as any one of the four inverters in the FIG. 1A circuit;

DETAILED DESCRIPTION

Figure 1A:
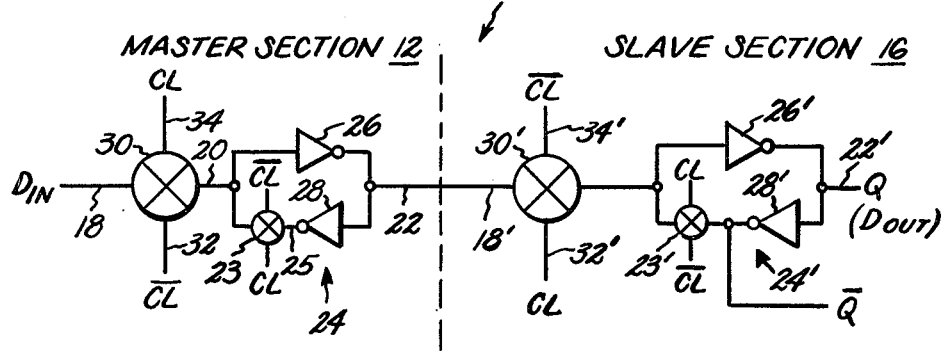
FIG. 1A is an electrical schematic block diagram of a prior art master-slave or edge-triggered D-type flip-flop including a master section and a slave section.

It is believed that the invention, its operation and its advantages will be better understood in view of a preliminary review of the characteristics of IGFETs of the type employed in static memory cells. It will be appreciated that the term insulated-gate field-effect transistor (IGFET) is employed here in a generic sense to include various similar field-effect transistor devices such as metal-oxide-semiconductor field-effect transistors (MOSFETs) and metal-insulator-semiconductor field-effect transistors (MISFETs).

In the FIGS., only enhancement-mode IGFETs are shown, designated in conventional fashion by means of a broken channel bar symbol. An N-channel IGFET is indicated by an arrow extending inwardly to the central element of the broken bar and a P-channel IGFET is indicated by an arrow extending outwardly from the central element of the broken bar. Also, for convenience, P-channel IGFETs are further identified by the letter P followed by a particular reference numeral, and N-channel IGFETs are further identified by the letter N followed by a particular reference numeral.

In further pertinent review, each enhancement-mode IGFET has a pair of main terminals (source and drain) which define the ends of its conduction channel, as well as a gate electrode, the applied potential on which determines the conductivity of the conduction channel. For a P-channel IGFET, the source terminal is defined as that one of the main terminals having the more positive (higher) voltage potential applied thereto. For an N-channel IGFET, the source terminal is defined as that one of the main electrodes having the more negative (lower) voltage potential applied thereto. In either case, conduction occurs when the applied gate-to-source potential ($V_{GS}$) is both of the proper polarity to turn on the transistor, and is greater in magnitude than the threshold voltage $V_T$ of the particular transistor. The requirement that the gate-to-source potential exceed the threshold potential $V_T$ to turn ON an IGFET may for convenience be termed "threshold voltage $V_T$ offset", and relates to a significant aspect of the present invention.

To turn on a P-channel IGFET, the gate voltage ($V_G$) must be more negative than the source voltage $V_S$ by at least $V_T$. On an N-channel IGFET, $V_G$ must be more positive than $V_S$ by at least $V_T$.

In addition to the general operational characteristics of IGFETs, summarized immediately above, it is well known that specific IGFETs can be configured during fabrication to have any one of a variety of particular device characteristics. For example, threshold voltage $V_T$ and conductivity can be significantly affected through choice of channel dimensions and choice of gate insulating layer thickness.

The IGFETs employed are essentially symmetrical devices in structure wherein the source and drain regions may be interchanged. In the case of the inverter and cross-coupled switching element transistors, one main terminal is always the source, and is so schematically represented by placement of the gate terminal at the source end of the device. In the case of the transmission gate transistors, it is not strictly possible to designate which main terminal is the source and which is the drain because, during operation, the polarities alternate.

Finally, it should be noted that in the following discussion a potential at, or near, ground is arbitrarily defined as logic "low" (or binary "0"), and any potential at or near $+V_{DD}$ volts is arbitrarily defined as logic "high" (binary "1").

It is further believed that the present invention will be better understood and appreciated in view of several specific electrical circuits representative of prior art static flip-flops. Accordingly, such representative circuits are described next in detail with reference to FIGS. 1A, 1B, 1C and 1D.

FIG. 1A is a block diagram of a prior art edge-triggered D-type static flip-flop 10 having a master section 12 to the left of the dash line 14 and a slave section 16 to the right of the dash line 14. The flip-flop 10 has a data input node $D_{in}$, a data output node Q, and a complementary data output node $\overline{Q}$. Particularly in shift register applications, the Q data output node may also be referred to as a $D_{out}$ node.

Each of the master and slave sections 12 and 16 may be viewed as an inverting latch cell. The cells 12 and 16 have respective data inputs 18 and 18', respective combination complementary data storage and complementary data output nodes 20 and 20', and respective combination data storage and data output nodes 22 and 22'. Since one stage of inversion occurs from the cell data input node 18 and the cell data output node 22, and then another stage of inversion occurs between the cell 16 data input node 18' and the data output node 22', overall there is no logic level inversion from the input $D_{in}$ to the Q output. For applications where a $\overline{Q}$ output of the overall flip-flop 10 is required, the $\overline{Q}$ output line is connected to the complementary data storage and output node 20' of the slave section or cell 16 through transmission gate 23'.

The flip-flop sections or cells 12 and 16 comprise respective latches 24 and 24', each of the latches 24 and 24' more particularly including a forward-going CMOS inverter 26 or 26' and a reverse-going CMOS inverter 28 or 28' cross-coupled in a latching configuration through transmission gates 23 and 23', i.e., with the inputs of the inverters 26 and 26' connected to the outputs of the inverters 28 and 28', and the inputs of the inverters 28 and 28' connected to the outputs of the inverters 26 and 26' respectively. Thus, the nodes 22 and 20 or 22' and 20' are always complements of each other. Further, if either of the cell data storage and output nodes 22 and 22', respectively, is driven to either of the two logic levels, then the corresponding latch 24 or 24' toggles and the corresponding complementary data storage and output node 20 or 20' is driven to the opposite logic state.

The cells 12 and 16 include respective CMOS transmission gates 30 and 30' connected respectively between the nodes 18 and 20 and the nodes 18' and 20'. The transmission gates 30 and 30' have respective active high clock inputs 32 and 32', and respective active-low clock inputs 34 and 34'. A particular transmission gate is ON when its active-high clock input 32 or 32' is at logic high and its active-low clock input 34 or 34' is at logic low, and is OFF or in its non-conducting state when its active-high clock input 32 or 32' is low and its active-low clock input 34 or 34' is high.

In the circuit of FIG. 1A, the transmission gate clock inputs are driven by complementary clock lines CL and $\overline{CL}$ connected such that transmission gates 30 and 30' are alternately such that the transmission gates 30 and 30' are alternately enabled.

Figure 1B:
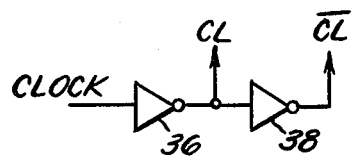
FIG. 1B is an electrical schematic block diagram of a circuit for generating a pair of complementary clock input signals from a single clock input.

With reference to FIG. 1B, the manner in which the CL and $\overline{CL}$ lines of FIG. 1A are typically driven is depicted. In particular, a CLOCK line is connected to a pair of series-connected inverters 36 and 38, the CL line being driven by the output of the first inverter 36 and the $\overline{CL}$ line being driven by the output of the second inverter 38. In the particular circuit of FIG. 1B, the first inverter 36 serves merely as a buffer.

In the operation of the circuit represented by FIGS. 1A and 1B, when CLOCK is low, the transmission gate 30 of the master section 12 is enabled and the transmission gate 30' of the slave section 16 is not enabled. A logic level present at the flip-flop data input $D_{in}$ is coupled through the transmission gate 30 into the latch comprising cross-coupled inverters 26 and 28. The node 22 is at the complementary logic level of $D_{in}$, and the node 25 is at the complementary logic level as $D_{in}$. When the CLOCK line goes high, the transmission gate 30 becomes non-conducting, isolating the $D_{in}$ input, and the transmission gate 30' in the slave section 16 and the transmission gate 23 begin conducting, coupling the logic level present at the node 20 into the node 22', and thus into the latch comprising cross-coupled inverters 26' and 28'. Data and complementary data thus appear at the Q and $\overline{Q}$ outputs respectively.

Figure 1C:
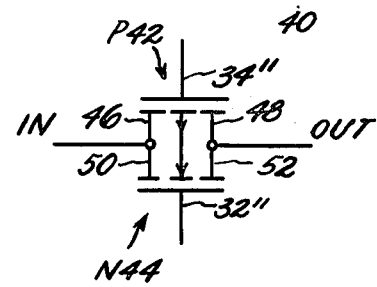
FIG. 1C is an electrical schematic diagram of a prior art standard CMOS transmission gate such as may be employed as either of the two transmission gates in the FIG. 1A circuit.
Figure 1C:
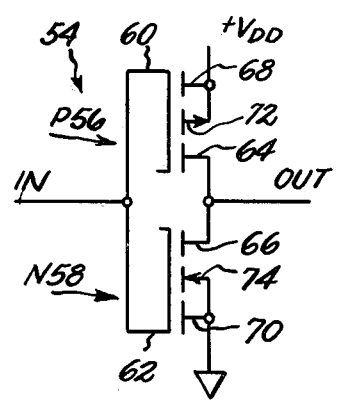

FIG. 1C is a schematic diagram of a prior art CMOS transmission gate 40 such as may be employed as each of the transmission gates 30 and 30' in the circuit of FIG. 1A. The FIG. 1C transmission gate 40 comprises a complementary pair of IGFETs, specifically, a P-channel IGFET P42 and an N-channel IGFET N44. The conduction channels of the two IGFETs P42 and N44 are connected in series between the transmission gate 40 input (IN) and output (OUT). Specifically, main terminals 46 and 48 of the P-channel IGFET P42 are connected to the input and output respectively, and main terminals 50 and 52 of the N-channel IGFET N44 are connected to the input and output respectively. The gate terminal 32" of the N-channel IGFET N44 serves as the active-high transmission gate-enabling input, and the gate terminal 34" of the P-channel IGFET P42 serves as the active-low transmission gate-enabling input of the transmission gate 40.

Considering the operation of the FIG. 1C prior art transmission gate 40, when a logic low level is applied to the gate 32" of the N-channel IGFET N44 and a logic high level is applied to the gate 34" of the P-channel IGFET P42, the transmission gate 40 is in its non-conducting or OFF state because both IGFETs N44 and P42 are OFF. In particular, the gate 32" of the N-channel IGFET N44, being at logic low, cannot be more positive than either of the main terminals 50 or 52, regardless of which is considered the source terminal. The gate terminal 34" of the P-channel IGFET P42, being at logic high, cannot be more negative than either of the main terminals 46 or 48, regardless of which is considered the source terminal.

For turning ON the transmission gate 40, the gate terminal 32" of the N-channel IGFET N44 is driven to logic high, and gate 34" of the P-channel IGFET P42 is driven to logic low. For a logic low input on the line IN, assuming the output line OUT was previously at logic high, then the terminal 50 of the N-channel transistor N44 is the source terminal and the main terminal 52 is the drain terminal. The N-channel transistor N44 then conducts in a common-source circuit configuration, i.e., is fully ON since the transistor N44 gate voltage is clearly more positive than the source voltage by at least the threshold voltage offset $V_T$. At the same time, with the input line IN at logic low, then the terminal 46 of the P-channel transistor P42 serves as the drain terminal, and the terminal 48 serves as the source terminal. Thus, the P-channel transistor P44 initially conducts as in a source-follower circuit configuration, but then conduction through the P-channel transistor P44 ceases as the output of line OUT goes low and the voltage on the gate 34" is no longer more negative than the voltage on the source terminal 48'.

For a logic high input on the input line IN, the P-channel transistor P42 conducts as in a common-source circuit configuration, to fully pull the output line OUT to logic high, and the N-channel N44 conducts only in the source-follower mode and ceases conducting before it can pull the output line OUT fully to logic high due to threshold voltage offset.

Thus, in conventional CMOS transmission gates, in order to avoid the effect of threshold voltage $V_T$ offset turning off a transistor before the output is pulled fully to the input logic voltage level, both a P-channel and an N-channel transistor are required.

With reference to the final prior art figure, FIG. 1D is an electrical schematic diagram of a standard CMOS inverter 54 such as may be employed as each of the inverters 26, 26', 28 and 28' in the circuit of FIG. 1A. The FIG. 1D inverter 54 comprises a pair of complementary IGFETs, specifically, a P-channel IGFET P56 and an N-channel IGFET N58, having their respective gate electrodes 60 and 62 connected together and to the inverter input IN. The transistor drain terminals 64 and 66 are connected together and to the inverter output OUT. The source terminal 68 of the P-channel transistor P56 is connected to $+V_{DD}$, and the source terminal 70 of the N-channel transistor N58 is connected to circuit ground. In accordance with conventional practice, the substrate terminal 72 of the P-channel transistor P56 is connected to $+V_{DD}$, and the substrate terminal 74 of the N-channel transistor N58 is connected to ground.

In operation, assuming a logic low input, then the N-channel transistor N58 is OFF, and the P-channel transistor P56 is ON. The P-channel transistor P56 therefore electrically connects the output line OUT to $+V_{DD}$, for a logic high output. In the complementary case of a logic high input, the P-channel transistor P56 is OFF, and the N-channel transistor P58 is ON. The N-channel N58 therefore constitutes an electrical connection between the output line OUT and ground, thereby pulling the output line OUT to logic low.

Figure 2:
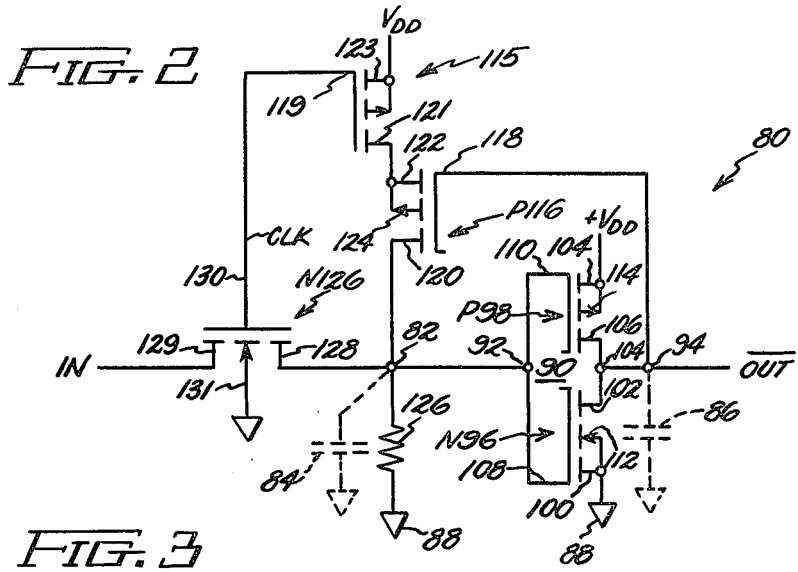
FIG. 2 is an electrical schematic diagram of a basic inverting latch cell in accordance with the invention.

With reference now to FIG. 2, shown is an electrical schematic diagram of an inverting latch cell 80 in accordance with the invention, which cell 80 may be compared, in terms of function, to either of the cells 12 and 16 of FIG. 1A. However, the inventive cell 80 of FIG. 2 includes only five IGFETs, in contrast to the eight IGFETs included in each of the cells 12 and 16 of prior art FIG. 1A.

Considering FIG. 2 in detail, the inverting latch cell 80 has a data input node IN, a complementary data output node $\overline{OUT}$, and a clock input node CLK for selectively enabling or not enabling the cell 80. The cell 80 also includes an intermediate node 82, not directly accessible to circuitry external to the cell 80, which node 82 may be termed a data storage node 82. Parasitic capacitances are present at both the data storage node 82 and the output node $\overline{OUT}$, these parasitic capacitances being respectively represented by fixed capacitors 84 and 86 shown in phantom. The cell 80 also includes a pair of voltage supply nodes, one of which is a ground voltage supply node 88, and the other of which is a $+V_{DD}$ voltage supply node.

The cell 80 includes, as an active element, an inverter 90 which comprises a standard CMOS inverter such as is described above with reference to FIG. 1D. The inverter 90 input 92 is connected to the data storage node 82, and the inverter output 94 is connected to the complementary data output node $\overline{OUT}$. More particularly, the inverter 90 includes a complementary pair of IGFETs, an N-channel IGFET N96 having its channel arranged to selectively electrically connect the complementary data output node $\overline{OUT}$ to the ground voltage supply node 88, and a P-channel IGFET P98 having a channel arranged to selectively electrically connect the complementary data output node $\overline{OUT}$ to the $+V_{DD}$ voltage supply node. Thus, the N-channel transistor N96 has its source terminal 100 connected to circuit ground and its drain terminal 102 connected to the inverter output 94 and thus to the complementary data output node OUT, and the P-channel transistor P98 has its source terminal 104 connected to $+V_{DD}$ and its drain terminal 106 connected to the inverter output 94 and thus to the complementary data output node $\overline{OUT}$. The gate terminals 108 and 110, respectively, of the two transistors N96 and P98 are connected to the inverter input 92 and thus to the data storage node 82. Finally, the substrate terminal 112 of the N-channel transistor N96 is connected to ground, and the substrate terminal 114 of the P-channel transistor P98 is connected to $+V_{DD}$.

Comparing the FIG. 2 cell 80 with either of the cells 12 or 16 of prior art FIG. 1A, it will be appreciated that the FIG. 2 inverter 90 corresponds generally to either of the forward-going inverters 26 or 26' of FIG. 1A. However, in contrast to FIG. 1A, the inverting latch cell 80 of FIG. 2 does not include a reverse-going inverter directly comparable to the reverse-going inverters 28 and 28' of FIG. 1A. Rather, the inventive cell 80 of FIG. 2 includes a cross-coupled switching element comprising a single P-channel IGFET P116. The transistor P116 gate terminal 118 comprises the switching element input and is connected to the complementary data output node $\overline{OUT}$. The transistor P116 drain terminal 120 constitutes the switching element output and is connected to the data storage node 82. The channel of the transistor P116 is arranged to selectively connect the data storage node 82 to $+V_{DD}$ during the time when CLK is low. Thus, the source terminal 122 of the transistor P116 is connected to $+V_{DD}$ through transistor P115 when CLK is low. Finally, the substrate terminal 124 of the P-channel transistor P116 is connected to $+V_{DD}$.

While the transistor P116 serves to pull the data storage node 82 up to $+V_{DD}$, there is no corresponding transistor for pulling the data storage node 82 to ground. Rather, a high impedance leakage current discharge path, depicted schematically in FIG. 2 as a discrete resistor 126, electrically connects the data storage node 82 to ground 88. The leakage current discharge path represented by the resistor 126 has a relatively high resistance, in the range of 100 megohms, or more, and need only be sufficient to discharge to ground any leakage current appearing on the data storage node 82, for example, through the P-channel transistor P116, during those periods of operation when the data storage node 82 is to be at logic low. The leakage current discharge path represented by the resistor 126 can take many forms, and need not comprise a discrete resistor at all.

Finally, for coupling data into the cell 80, a transmission gate comprises a single N-channel IGFET N126 arranged to selectively connect the data storage node 82 to the data input node IN. Accordingly, the main terminals 128 and 129 of the tranmission gate transistor N126 are respectively connected to the data storage node 82 and the input node IN. To control the transmission gate transistor N126, its gate electrode 130 is connected to the CLK input node. The substrate terminal 131 of the N-channel transistor N126 is connected to ground.

Considering the operation of the FIG. 2 cell 80, it will be appreciated that the N-channel transistor N96 of the inverter 90 and the P-channel transistor P116 of the cross-coupled switching element together comprise a latch which, when both transistors N96 and P116 are conducting, holds the complementary data output node $\overline{OUT}$ at logic low (through the transistor N96) and the data storage node 82 at logic high (through the transistor P116). Under these conditions, the N-channel transistor N96 is maintained in a conducting state because its gate 108 is cross-coupled to the data storage node 82 held at logic high through the transistor P116, and the P-channel transistor P116 is maintained in its conducting state because its gate 118 is cross-coupled to the complementary data output node $\overline{OUT}$ maintained at logic low through the N-channel transistor N96.

To reverse the state of the cell 80, i.e. to cause the complementary data output node $\overline{OUT}$ to go to logic high, a logic low is applied at the input node IN, and the transmission gate transistor N126 is enabled by applying a logic high signal to its gate terminal 130 via the CLK input. At the same time the logic low signal when applied to transistor P115 disconnects the source of transistor p116 from $V_{DD}$. With a logic low input on the node IN, the terminal 129 of the gating transistor N126 is low. The terminal 129 thus serves as the source terminal of the N-channel transistor N126. The other terminal 128 then serves as the drain terminal. The transistor N126 therefore conducts as in a common-source circuit configuration and is fully ON, with threshold voltage offset $V_T$ not being a factor. The transistor N126 conducting begins to pull the data storage node 82 low. The transistor P116 which had maintained the data storage node 82 at logic high is now isolated from $V_{DD}$. As the data storage node 82 goes towards logic low, the P-channel inverter transistor P98 begins to conduct while the N-channel inverter transistor N96 begins to turn OFF, thereby beginning to pull the complementary data output $\overline{OUT}$ towards logic high. Since the gate 118 of the transistor P116 is connected to the complementary data output node $\overline{OUT}$, this decreases the conductivity of the transistor P116. This action continues relatively rapidly until such time as the data storage node 82 is fully at logic low, the P-channel inverter transistor P98 is fully ON pulling the complementary data output node $\overline{OUT}$ to logic high, and both transistors N96 and P116 are OFF.

When the CLK input again goes low, turning OFF the transmission gate transistor N126, the cell 80 is maintained in the condition with the complementary data output node $\overline{OUT}$ high and the data storage node 82 low so long as the leakage current discharge path 126 has sufficient conductance to discharge any leakage current appearing at the data storage node 82, for example, through the P-channel transistor P116. Thus, the resistance 126 need have impedance sufficient only to remove leakage current at the data storage node 82. A variety of relatively simple means may therefore be used to form the resistor 126, several of which are described hereinbelow with reference to FIGS. 7 and 8.

The complementary operation when the complementary data output node $\overline{OUT}$ is initially at logic high, the data storage node 82 is initially at logic low, and the input node IN is at logic high will now be considered. When the CLK input goes high, the transmission gate transistor N126 is initially biased into conduction. Under these conditions, the transistor N126 terminal 128 serves as the source terminal, and the terminal 130 serves as the drain terminal. Accordingly, the transmission gate transistor N126 operates as in a source-follower circuit configuration and, due to threshold voltage $V_T$ offset, ceases conducting before the data storage node 82 is pulled fully to logic high. More particularly, as summarized above, for an N-channel transistor to conduct the gate voltage must be more positive than the source voltage by at least the threshold voltage $V_T$. Initially, with the gate terminal 130 fully at logic high and the source terminal 128 fully at logic low, the gate voltage condition is met and the N-channel transmission gate transistor N126 conducts. However, as the data storage node 82 is pulled towards logic high, the source terminal 128 voltage also increases, until the gate 130 voltage no longer exceeds the source 128 voltage by at least $V_T$, and the transmission gate transistor N126 ceases conducting.

However, significantly, the only opposition to pulling the data storage node 82 to logic high is offered by the high impedance leakage current resistance 126, which amounts to no opposition at all because of its high impedance. Accordingly, even though the transmission gate transistor N126 is only partially conducting as in a source-follower circuit configuration, the data storage node 82 is pulled sufficiently high to begin turning ON the inverter transistor N96 and begin turning OFF the inverter transistor P98, thereby beginning to pull the complementary data output node $\overline{OUT}$ to logic low. This begins to turn ON the transistor P116, which takes over the job of pulling the data storage node 82 to logic high as the transmission gate transistor N126 ceases conducting and CLK moves low. A regenerative switching action takes place between the inverter N-channel transistor N96 and the cross-coupled switching transistor P116 to then fully pull the complementary data output node $\overline{OUT}$ to logic low and the data storage node 82 to logic high.

It is significant that the only output of the cell 80, i.e., the complementary data output node $\overline{OUT}$, is driven by the CMOS inverter 90 having two transistors N96 and P98, and is thus fully able to both source and sink current, providing a low impedance output at either logic state. The same cannot be said of the data storage node 82 because it is not capable of sinking current, i.e., the node 82 could not serve as a low-impedance output for a logic low condition. However, the node 82 is employed only as a data storage node, and not as an output, and there is accordingly no problem.

Figure 3:
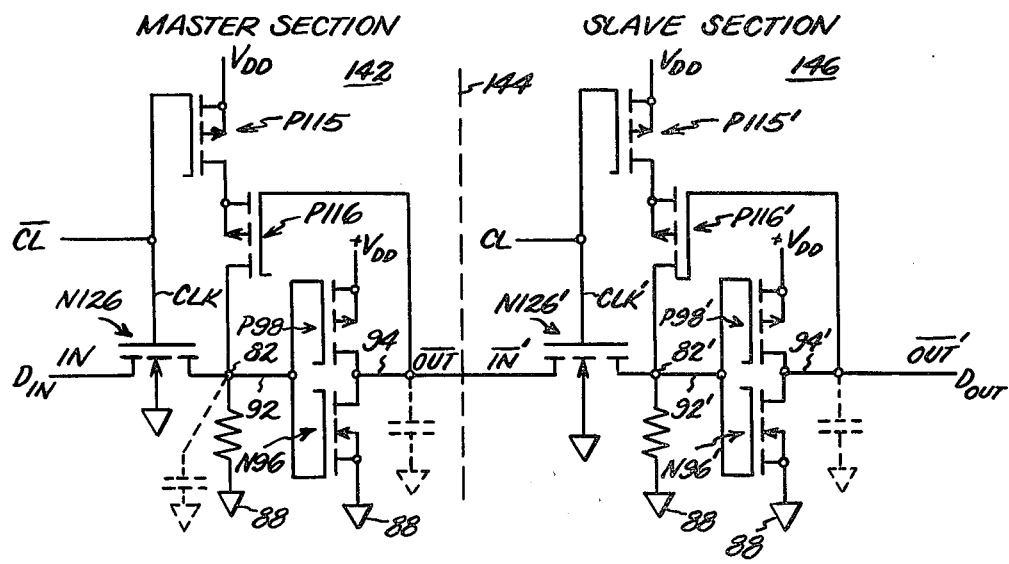
FIG. 3 is an electrical schematic diagram depicting a pair of the FIG. 2 inverting latch cells connected in series to form an edge-triggered D-type flip-flop in accordance with the invention.

FIG. 3 depicts an electrical schematic diagram of an edge-triggered D-type flip-flop 140 in accordance with the invention, which comprises a master section 142 to the left of a dash line 144, and a slave section 146 to the right of the dash line 144. The flip-flop 140 may also be viewed as a single stage of a static shift register, as will be apparent from FIG. 4, described hereinbelow.

In FIG. 3, each of the sections 142 and 146 comprises an inverting latch cell identical to the inverting latch cell 80 of FIG. 2. Accordingly, the detailed description of the master inverting latch cell 142 and the slave inverting latch cell 146 will not be repeated. For convenience, the master inverting latch cell 142 employs the same reference numerals as in FIG. 2, and the slave inverting latch cell 146 employs corresponding primed reference numerals.

External connections to the flip-flop 140, in addition to the voltage supply nodes $+V_{DD}$ and ground 88, are a data input node $D_{in}$, a data output node $D_{out}$, and a pair of complementary clock input nodes CL and $\overline{CL}$. The flip-flop data input node $D_{in}$ corresponds and is connected to the data input node IN of the master cell 142, and the flip-flop data output node $D_{out}$ corresponds and is connected to the complementary data output node $\overline{OUT}'$ of the slave cell 146. The two cells 142 and 146 are connected in series, with the complementary data output node $\overline{OUT}$ of the master cell 142 connected to the input node IN' of the slave cell 146. Finally, the clock input node CLK of the master cell 142 is connected to one of the pair of flip-flop complementary clock input nodes, for example $\overline{CL}$, and the clock input node CLK' of the slave cell 146 is connected to the other of the flip-flop complementary clock nodes, in this example, CL. Thus, the respective transmission gate transistors N126 and N126', and thus the corresponding cells 142 and 146 are alternately enabled. The complementary clock input nodes CL and $\overline{CL}$ can be driven through a pair of inverters such as is described above with reference to prior art FIG. 1B.

The flip-flop data input node $D_{in}$ may also be viewed as the D input of a D-type flip-flop, and the flip-flop data output $D_{out}$ may also be viewed as the Q output of a D-type flip-flop. The circuit of FIG. 3 does not provide a $\overline{Q}$ output since the data storage node 82' of the slave cell 146 is not suitable for use as an output since it cannot sink current.

Operation of the two sections 142 and 146 of the FIG. 3 flip-flop 140 proceeds in a generally conventional manner with, however, the two cells 142 and 146 functioning in the manner described above with reference to the FIG. 2 cell 80.

To briefly describe the operation, with CL low and $\overline{CL}$ high, the transmission gate N126 and the master cell 142 are enabled, and the transmission gate transistor N126' and the slave cell 146 are not enabled. Under these conditions, data at the input $D_{in}$ is transferred to the data storage node 82 of the master cell 142, and complementary data appears at the complementary data output node $\overline{OUT}$ of the master section 142. The output $D_{out}$ or Q of the overall flip-flop 140 remains latched in its previous state since the slave cell 146 is isolated from the master cell 142 by virtue of the transmission gate transistor N126' being OFF.

When CL goes high and $\overline{CL}$ goes low, the transmission gate transistor N126 turns OFF, isolating the master cell 142 from the data input $D_{in}$, and the transmission gate transistor N126' turns ON, coupling the complementary data output node $\overline{OUT}$ of the master cell 142 and the input IN' of the slave cell 146 to the data storage node 82' of the slave cell 146. The complement of the logic level of the data storage node 82' appears at the inverter 90' output 94', and therefore at the flip-flop data output $D_{out}$ or Q. With two inverting stages 90 and 90' in series, it will be appreciated that the logic level at the flip-flop data output $D_{out}$ or Q is the same as that previously present at the flip-flop data input $D_{in}$.

Figure 4:
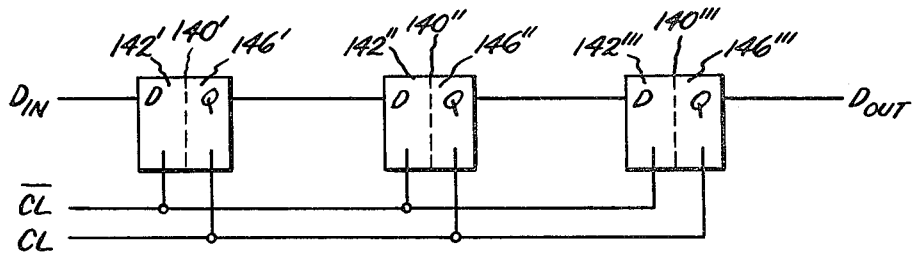
FIG. 4 is an electrical schematic block diagram showing the manner in which a plurality of the FIG. 3 D-type flip-flops may each serve as a shift register stage and be connected in series to form a shift register.

FIG. 4 depicts the manner in which a plurality of D-type flip-flops such as the flip-flop 140 of FIG. 3 may be connected in series to form a static shift register 150 configuration. In FIG. 4, three shift register stages are shown, 140', 140" and 140''', all connected in series. More particularly, the D input of the first shift register stage 140' serves as the data input $D_{in}$ of the overall shift register 150, and the Q output of the last shift register stage 140'41 serves as the data output $D_{out}$ of the overall shift register 150. Intermediate shift register stages, such as the intermediate stage 140", are connected with each stage D input node connected to the Q output node of the preceding stage, and the Q output node correspondingly connected to the D input node of each succeeding shift register stage. While only a single intermediate stage 140" is depicted in FIG. 4, it will be appreciated that there is no particular limitation on the number of intermediate shift register stages which may be connected in series.

Significantly, the shift register 150 does not require that complementary data outputs (i.e. $\overline{Q}$ data outputs) of any of the stages 140', 140" or 140''' be employed, and so inverting latch cells such as the FIG. 2 inverting latch cell 80 can be employed throughout.

Figure 5:
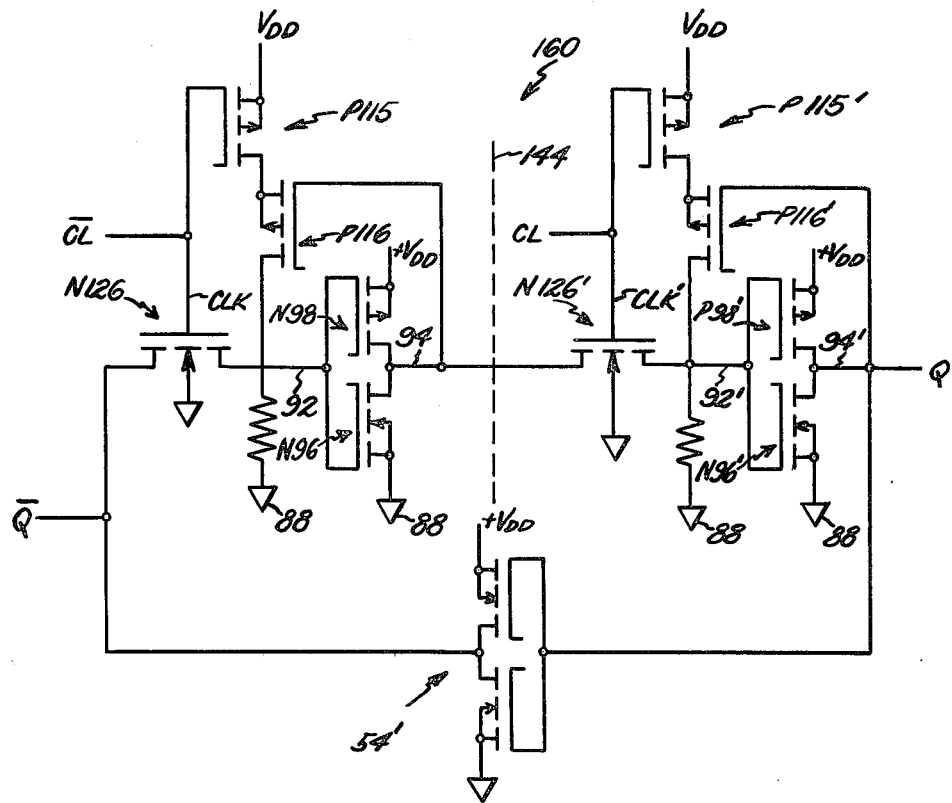
FIG. 5 is an electrical schematic diagram of a divide-by-two flip-flop in accordance with the invention.
Figure 6:
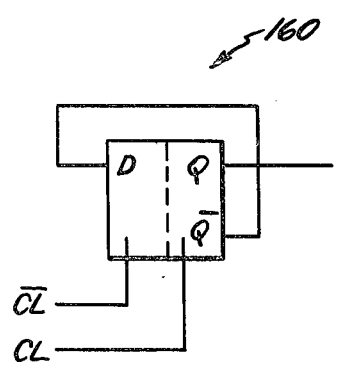
FIG. 6 is a block diagram depiction of the FIG. 5 divide-by-two flip-flop of the invention.

FIG. 5 is an electrical schematic diagram of a divide-by-two flip-flop 160 in accordance with the invention, while FIG. 6 is a schematic symbol equivalent to the FIG. 5 divide-by-two flip-flop.

As is known, a divide-by-two flip-flop may be formed by connecting the $\overline{Q}$ output of an edge-triggered D-type flip-flop back to the flip-flop D input, as is represented in FIG. 6. Such a configuration is particularly useful in asynchronous binary counter stages, where either the Q or $\overline{Q}$ output of one stage is connected to the clock input of each succeeding stage.

However, as will be apparent from FIG. 6, a $\overline{Q}$ output is required. Accordingly, in FIG. 5, the master section or cell 162 comprises a cell such as the inventive cell 80, and the slave cell or section 164 comprises also such a cell 80 with an inverter circuit 54' such as shown in prior art FIG. 1D.

Figure 7:
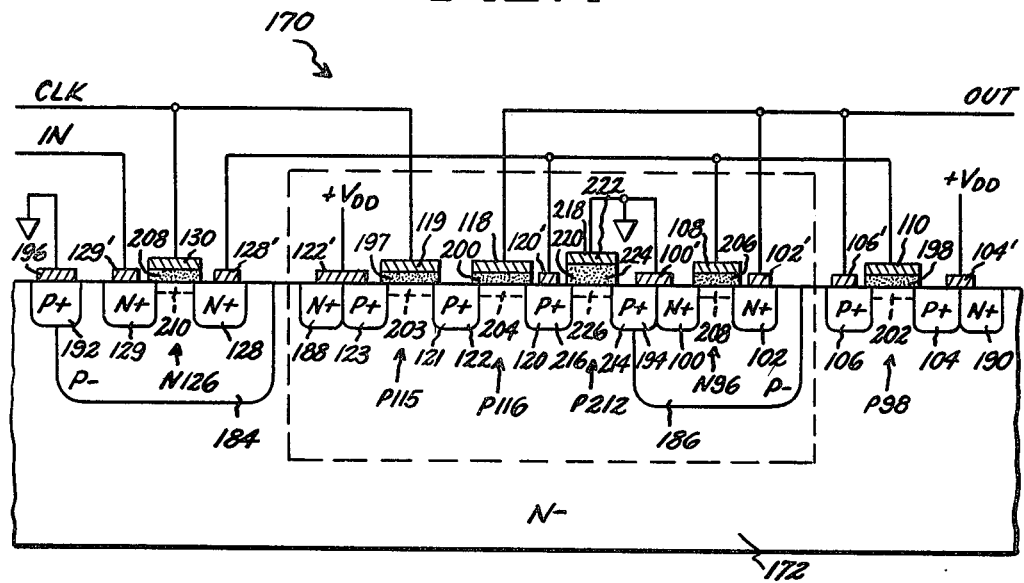
FIG. 7 is a cross-sectional representation of the physical structure of a memory cell in accordance with the invention and corresponding to the basic inverting latch cell circuit of FIG. 2.

With reference now to FIG. 7, a specific structure 170 implementing the circuit of FIG. 2 will now be described. For convenience, identical reference numerals are employed in FIG. 7 to designate structural elements corresponding to symbols in the electrical schematic diagram of FIG. 2. Specifically, semiconductor terminal regions in FIG. 7 are designated with the same numerals as the main terminals of the various IGFETs of FIG. 2, and main terminal electrode metallization areas are designated with primed reference numerals. It will be appreciated that, while FIG. 7 depicts one exemplary structure, it is nevertheless a highly-schematic depiction, omitting a number of conventional features required in practical devices. Also, FIG. 7 is a cross-sectional view only, and indicates the required surface metallization pattern in a schematic manner only.

The latch cell structure 170 of FIG. 7 is formed on a portion 172 of an N⁻ conductivity type silicon semiconductor substrate or wafer which, as will be appreciated, is but a small portion of an overall integrated circuit device. The P⁻ conductivity type substrate required for complementary N-channel IGFETs is obtained by implanting lightly-doped well region portions 184 and 186 into the N⁻ conductivity type substrate 172.

In order to maintain the N⁻ conductivity type substrate 172 at $+V_{DD}$ potential, an ohmic contact to $+V_{DD}$ is provided by means of redundant heavily-doped N+ conductivity type contact regions 188 and 190 diffused into the substrate 172 and in ohmic contact with $+V_{DD}$ via contact metallization areas 122′ and 104′ respectively shared with the source terminal 122 of the P-channel transistor P116 and the source terminal 104 of the P-channel transistor P98.

Similarly, in order to maintain the P⁻ conductivity type well region portions 184 and 186 at ground potential, ohmic contacts are provided in the form of heavily-doped P+ contact regions 192 and 194 adjoining the P⁻ well region portions 184 and 186 and connected to circuit ground respectively via a metallization area 196 and a metallization area 100′ which serves also to connect the source terminal 100 of the N-channel IGFET N96 to ground. So long as proper supply voltage is maintained to the circuit, all PN junction diodes defined within the substrate 172 are reverse-biased.

The P-channel IGFETs P98, P115 and P116 are formed within the N⁻ conductivity type substrate 172 in conventional fashion by providing heavily-doped P+ conductivity type terminal regions 104, 106, 120, 122 and 123 within the substrate 172. To complete the structures of the P-channel IGFETs P98, P115 and P116, their respective gate electrodes 119, 110 and 118 are spaced from the substrate 172 by insulating layers 197, 198 and 200. The insulating layers 197, 198 and 200 may comprise any suitable insulating material, for example, silicon dioxide. The gate electrodes 119, 110 and 118 themselves may comprise any suitable conductive material, such as aluminum or highly-doped polycrystalline silicon. Since the IGFETs P98, P115 and P116 are enhancement-mode devices, conduction channels only exist when induced by suitable voltages on the gate electrodes 119, 110 and 118, these induced conduction channels being represented at 203, 202 and 204.

The N-channel IGFETs N96 and N126 are formed within the P⁻ conductivity type well region portions 186 and 184. Specifically, N+ conductivity type terminal regions 100, 102, 128 and 129 are appropriately diffused within the well region portions 186 and 184. To complete the structures of the N-channel IGFETs N96 and N126, their respective gate electrodes 108 and 130 are spaced from the substrate 172 by insulating layers 206 and 208. Since the IGFETs N96 and N126 also are enhancement-mode devices, conduction channels only exist when induced by suitable voltages on the gate electrode 108 and 130, these induced conduction channels being represented at 208 and 210.

The final element depicted in FIG. 7 is an enhancement-mode IGFET P212 which serves as the high impedance leakage current discharge path 126. Advantageously, the transistor P212 is provided with minimal increase in chip area by utilizing, as its P+ conductivity type terminal regions, P+ regions which exist in any event on the N⁻ conductivity type substrate 172. In particular, the P+ conductivity type ohmic contact region 194 for the P⁻ well region 186 serves also as a drain region 214 of the leakage current discharge IGFET P212. The P+ conductivity type drain region 120 of the IGFET P116 serves also as a source region 216 of the leakage current discharge transistor P212. An insulated gate structure 218 is provided on the substrate 172 surface on a gap 220 between these two P+ conductivity type regions. The insulated-gate structure 218 comprises gate electrode metallization 222 connected to ground and a gate insulating layer 224. The gate electrode structure 218 serves to induce a conduction channel 226 when voltage is applied to the gate electrode 222.

With this arrangement, the transistor P212 gate voltage is always more negative than the transistor P212 source 216 voltage, and the transistor P212 is therefore always ON when voltage is applied between its source 216 and drain 214 terminals. However, the leakage transistor P212 is configured so as to have a relatively low conductivity, through suitable fabrication. This may be accomplished in a number of ways. For example, as depicted in FIG. 7, the gate insulating layer 224 may be made much thicker than the gate insulating layers of the other IGFETs. Also, the channel may be formed with a relatively narrower width. Correspondingly, the induced conduction channel 226 is drawn somewhat smaller than the conduction channels of the other IGFETs. Significantly, since the leakage current discharge resistance P212 is an enhancement-mode device, it may conveniently be fabricated at the same time as the other enhancement-mode devices, since the conduction channel is induced, rather than being a permanent device region.

Figure 8:
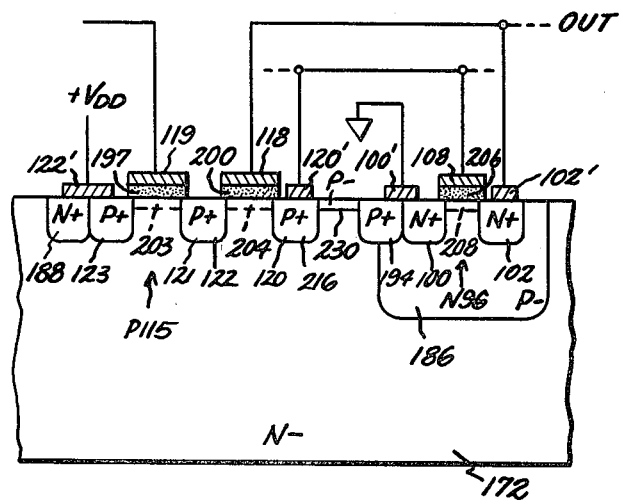
FIG. 8 is a partial cross-sectional representation of the invention and showing an alternative form of high impedance leakage current discharge path.

FIG. 8 depicts another structure for providing the high impedance leakage current discharge path. FIG. 8 depicts a modification of the portion of FIG. 7 included in the dotted enclosure thereof, all other portions being unchanged. In FIG. 8, the leakage current discharge transistor P212 is not included. Rather, a lightly-doped semiconductor region 230 is formed in the gap between the transistor P116 drain region 120 and the P+ ohmic contact region 194 to provide the high impedance leakage current discharge path. Typically, the lightly-doped P⁻ semiconductor region 230 is formed by implanting P-type semiconductor impurities, e.g. boron, at the surface.

Another alternative way in which the high impedance leakage current discharge path 126 shown in FIG. 2 may be provided is through the transmission gate transistor N126. Specifically, and referring again to FIG. 7, a reverse-biased PN junction diode is formed between the N+ conductivity type terminal region 128 and the P⁻ conductivity type well region portion 184, which well region portion 184 is maintained at circuit ground via the ohmic contact region 192 and the metallization 196. Through suitable process design, this PN junction diode can be made to have a slight leakage, sufficient to discharge the data storage node 82, shown in FIG. 2, to ground, thus serving as the high impedance leakage current discharge path 126 of FIG. 2.

A further way in which the high impedance leakage current discharge path 126 may be provided is by extension of gate electrode 108 or 110. A relatively lightly doped portion of the polycrystalline silicon material used to form electrodes 108 and 110 forms a link between electrode 108 or 110 and a ground terminal connection to that layer. Such lightly doped regions may be formed by shielding the deposited polycrystalline silicon during subsequent doping processing steps. Such extensions may be formed with little increase in cell area.

While specific embodiments of the invention have been illustrated and described herein, it is realized that numerous modifications and change will occur to those skilled in the art. For example, it will be appreciated that the P-conductivity type semiconductor can all be changed to N-conductivity type, and vice-versa, and the supply voltage polarity is reversed. It is therefore to be understood that the appended claims are intended to cover all such modifications and changes as fall within the true spirit and scope of the invention.

What is claimed is:

1. An inverting latch cell having a data input node, a complementary data output node, and a clock input node for selectively enabling or not enabling said cell, said cell comprising:
    a pair of voltage supply nodes;
    a data storage node;
    an inverter having an inverter input connected to said data storage node and an inverter output connected to said complementary data output node, said inverter including a complementary pair of insulated-gate field-effect transistors, one of said inverter transistors having a channel of one conductivity type arranged to selectively electrically connect said complementary data output node to one of said voltage supply nodes, the other of said inverter transistors having a channel of the opposite conductivity type arranged to selectively electrically connect said complementary data output node to the other of said voltage supply nodes, and said inverter transistors having gate electrodes for controlling the conductances of said respective inverter transistor channels and connected to said data storage node;
    a first switching element including an insulated-gate field-effect transistor having a channel of the opposite conductivity type and a gate electrode for controlling the conductance of said first switching element transistor channel, a second switching element including an insulated-gate field-effect transistor having a channel of the opposite conductivity type and a gate electrode for controlling the conductance of said second switching element transistor channel, said first switching element transistor channel and said second switching element transistor channel being connected in series in the order recited between said data storage node and said other voltage supply node, said first switching element transistor gate electrode connected to said complementary data output node, said second switching element transistor gate electrode connected to said clock input node;
    a high impedance leakage current discharge path electrically connecting said data storage node to said one voltage supply node; and
    a transmission gate including an insulated-gate field-effect transistor having a channel of the one conductivity type arranged to selectively connect said data storage node to said data input node, said transmission gate transistor having a gate electrode for controlling the conductance of said transmission gate transistor channel and connected to said clock input node.

2. A latch cell in accordance with claim 1, wherein said high impedance leakage current discharge path comprises a lightly-doped semiconductor region of the opposite conductivity type.

3. A latch cell in accordance with claim 1, wherein said high impedance leakage current discharge path comprises an enhancement-mode insulated-gate field-effect transistor having a channel of the opposite conductivity type, the source of said leakage transistor being connected to said data storage node, the drain and gate of said leakage transistor being connected to said one voltage supply node, and said leakage transistor being configured to have a lower conductivity relative to the conductivity of said switching element transistors.

4. An edge-triggered D-type flip-flop having a data input node, a data output node, and a pair of complementary clock input nodes for controlling the transfer of data from said flip-flop data input node to said flip-flop data output node, said flip-flop comprising:
    a pair of voltage supply nodes;
    a master inverting latch cell and a slave inverting latch cell, each of said latch cells in turn comprising:
        a cell data input node;
        a cell data storage node;
        a cell complementary data output node;
        a cell clock input node for selectively enabling or not enabling said cell;
        an inverter having an inverter input connected to said cell data storage node and an inverter output connected to said cell complementary data output node, said inverter including a complementary pair of insulated-gate field-effect transistors, one of said inverter transistors having a channel of one conductivity type arranged to selectively electrically connect said cell complementary data output node to one of said voltage supply nodes, the other of said inverter transistors having a channel of the opposite conductivity type arranged to selectively electrically connect said cell complementary data output node to the other of said voltage supply nodes, and said inverter transistors having gate electrodes for controlling the conductances of said respective inverter transistor channels and connected to said cell data storage node;
        a first switching element including an insulated-gate field-effect transistor having a channel of the opposite conductivity type and a gate electrode for controlling the conductance of said first switching element transistor channel, a second switching element including an insulated-gate field-effect transistor having a channel of the opposite conductivity type and a gate electrode for controlling the conductance of said second switching element transistor channel, said first switching element transistor channel and said second switching element transistor channel being connected in series in the order recited between said data storage node and said other voltage supply node, said first switching element transistor gate electrode connected to said complementary data output node, said second switch element transistor gate electrode connected to said clock input node;
        a high impedance leakage current discharge path electrically connecting said cell data storage node to said one voltage supply node; and
        a transmission gate including an insulated-gate field-effect transistor having a channel of the one conductivity type arranged to selectively connect said cell data storage node to said cell data input node, said transmission gate transistor having a gate electrode for controlling the conductance of said transmission gate transistor channel and connected to said cell clock input node;

said master cell data input node being connected to said flip-flop data input node;

said master cell complementary data output node being connected to said slave cell data input node;

said slave cell data output node being connected to said flip-flop data output node; and said master cell clock input node being connected to one of said pair of flip-flop complementary clock input nodes, and slave cell clock input node being connected to the other of said pair of flip-flop complementary clock input nodes, such that when complementary clock signals are applied to said complementary clock input nodes, respectively, said cells are alternately enabled.

5. A flip-flop in accordance with claim 4, wherein said high impedance leakage current discharge paths each comprise a lightly-doped semiconductor region of the opposite conductivity type.

6. A flip-flop in accordance with claim 4, wherein said high impedance leakage current discharge paths each comprise an enhancement-mode insulated-gate field-effect transistor having a channel of the opposite conductivity type, the source of said leakage transistor being connected to said cell data storage nodes, the drain and gate of said leakage transistor being connected to said one voltage supply node, and said leakage transistor being configured to have a lower conductivity relative to the conductivity of said switching element transistors.

7. A static shift register having a data input node, a data output node, and a pair of complementary clock input nodes for controlling the transfer of data from said shift register input node to said shift register data output node, said shift register comprising:
- a pair of voltage supply nodes;
- a plurality of shift register stages, each of said stages in turn comprising:
  - a stage data input node and a stage data output node;
  - a master inverting latch cell and a slave inverting latch cell, each of said latch cells including:
    - a cell data input node;
    - a cell data storage node;
    - a cell complementary data output node;
    - a cell clock input node for selectively enabling or not enabling said cell;
    - an inverter having an inverter input connected to said cell data storage node and an inverter output connected to said cell complementary data output node, said inverter including a complementary pair of insulated-gate field-effect transistors, one of said inverter transistors having a channel of one conductivity type arranged to selectively electrically connect said cell complementary data output node to one of said voltage supply nodes, the other of said inverter transistors having a channel of the opposite conductivity type arranged to selectively electrically connect said cell complementary data output node to the other of said voltage supply nodes, and said inverter transistors having gate electrodes for controlling the conductances of said respective inverter transistor channels and connected to said cell data storage node;
    - a first switching element including an insulated-gate field-effect transistor having a channel of the opposite conductivity type and a gate electrode for controlling the conductance of said first switching element transistor channel, a second switching element including an insulated-gate field-effect transistor having a channel of the opposite conductivity type and a gate electrode for controlling the conductance of said second switching element transistor channel, said first switching element transistor channel and said second switching element transistor channel being connected in series in the order recited between said data storage node and said other voltage supply node, said first switching element transistor gate electrode connected to said complementary data output node, said second switching element transistor gate electrode connected to said clock input node;
    - a high impedance leakage current discharge path electrically connecting said cell data storage node to said one voltage supply node; and
    - a transmission gate including an insulated-gate field-effect transistor having a channel of the one conductivity type arranged to selectively connect said cell data storage node to said cell data input node, said transmission gate transistor having a gate electrode for controlling the conductance of said transmission gate transistor channel and connected to said cell clock input node;
  - said master cell data input node of each stage being connected to said each stage data input node;
  - said master cell complementary data output node of each stage being connected to said slave cell data input node of said each stage;
  - said slave cell data output node of each stage being connected to said each stage data ouput node; and
  - said master cell clock input node of each stage being connected to one of said pair of shift register complementary clock input nodes, and slave cell clock input node of each stage being connected to the other of said pair of shift register complementary clock input nodes, such that when complementary signals are applied to said complementary clock input nodes, respectively, said cells of each stage are alternately enabled; and said shift register stages being connected in series with the first stage data input node being connected to said shift register data input node, the last stage data output node being connected to said shift register output node, and each intermediate stage having its data input node connected to the preceding stage data output node and having its data output node connected to the succeeding stage data input node.

8. A shift register in accordance with claim 7, wherein said high impedance leakage current discharge paths each comprise a lightly-doped semiconductor region of the opposite conductivity type.

9. A shift register in accordance with claim 7, wherein said high impedance leakage current discharge paths each comprise an enhancement-mode insulated-gate field-effect transistor having a channel of the opposite conductivity type, the source of said leakage transistor in each cell being connected to said each cell data storage node, the drain and gate of said leakage transistor in said each cell being connected to said one voltage supply node, and said leakage transistor in each cell being configured to have a lower conductivity relative to the conductivity of said switching element transistors in said each cell.

10. A divide-by-two flip-flop having at least a complementary data output node and a pair of complementary clock input nodes, said flip-flop comprising:
a pair of voltage supply nodes;
a master inverting latch cell and a slave inverting latch cell, each of said latch cells comprising:
  a cell data input node;
  a cell data storage node;
  a cell complementary data output node;
  a cell clock input node for selectively enabling or not enabling said cell;
  an inverter having an inverter input connected to said cell data storage node and an inverter output connected to said cell complementary data output node, said inverter including a complementary pair of insulated-gate field-effect transistors, one of said inverter transistors having a channel of one conductivity type arranged to selectively electrically connect said cell complementary data output node to one of said voltage supply nodes, the other of said inverter transistors having a channel of the opposite conductivity type arranged to selectively electrically connect said cell complementary data output node to the other of said voltage supply nodes, and said inverter transistors having gate electrodes for controlling the conductances of said respective inverter channels and connected to said cell data storage node;
a first switching element including an insulated-gate field-effect transistor having a channel of the opposite conductivity type and a gate electrode for controlling the conductance of said first switching element transistor channel, a second switching element including an insulated-gate field-effect transistor having a channel of the opposite conductivity type and a gate electrode for controlling the conductance of said second switching element transistor channel, said first switching element transitor channel and said second switching element transistor channel being connected in series in the order recited between said data storage node and said other voltage supply node, said first switching element transistor gate electrode connected to said complementary data output node, said second switching element transistor gate electrode connected to said clock input node;
a high impedance leakage current discharge path electrically connecting said cell data storage node to said one voltage supply node; and
a transmission gate including an insulated-gate field-effect transistor having a channel of the one conductivity type arranged to selectively connect said cell data storage node to said cell data input node, said transmission gate transistor having a gate electrode for controlling the conductance of said transmission gate transistor channel and connected to said cell clock input node;
an inverter having an inverter input connected to slave cell complementary data output node and an inverter output connected to said master cell data input node, said inverter including a complementary pair of insulated-gate field-effect transistors, one of said inverter transistors having a channel of one conductivity type arranged to selectively electrically connect said master cell complementary data input node to one of said voltage supply nodes, the other of said inverter transistors having a channel of the opposite conductivity type arranged to selectively electrically connect said master cell complementary data input node to the other of said voltage supply nodes, and said inverter transistors having gate electrodes for controlling the conductances of said respective inverter transistor channels and connected to said slave cell complementary output data node;
said master cell complementary data output node being connected to said slave cell data input node;
said master cell clock data input node being connected to one of said pair of complementary clock input nodes, and slave cell clock input node being connected to the other of said pair of flip-flop complementary clock input nodes, such that when complementary clock signals are applied to said complementary clock input nodes, said respective cells are alternately enabled.

11. A flip-flop in accordance with claim 10, wherein each said high impedance leakage current discharge path comprises a lightly-doped semiconductor region of the opposite conductivity type.

12. A flip-flop in accordance with claim 10, wherein each said high impedance leakage current discharge path comprises an enhancement-mode insulated-gate field-effect transistor having a channel of the opposite conductivity type, the source of said leakage transistor being connected to said cell data storage node, the drain and gate of said leakage transistor being connected to said one voltage supply node, and said leakage transistor being configured to have a lower conductivity relative to the conductivity of said switching element transistors.

* * * * *